(12) United States Patent
Kim et al.

(10) Patent No.: US 12,707,816 B2
(45) Date of Patent: Aug. 11, 2026

(54) DISPLAY APPARATUS

(71) Applicant: Samsung Display Co., Ltd., Yongin-si (KR)

(72) Inventors: Jeehoon Kim, Yongin-si (KR); Donghan Kang, Yongin-si (KR); Shinhyuk Yang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 785 days.

(21) Appl. No.: 17/981,263

(22) Filed: Nov. 4, 2022

(65) Prior Publication Data

US 2023/0217713 A1 Jul. 6, 2023

(30) Foreign Application Priority Data

Jan. 4, 2022 (KR) ........................ 10-2022-0000930

(51) Int. Cl.
*H10K 59/121* (2023.01)
*H10D 30/67* (2025.01)
(Continued)

(52) U.S. Cl.
CPC ..... *H10K 59/1216* (2023.02); *H10K 59/1213* (2023.02); *H10K 59/131* (2023.02);
(Continued)

(58) Field of Classification Search
CPC ........... H10K 59/1216; H10K 59/1213; H10K 59/131; H10K 59/121; H10K 59/12;
(Continued)

(56) References Cited

U.S. PATENT DOCUMENTS 5,132,745 A * 7/1992 Kwasnick .......... H10D 30/0316
257/E21.414
5,156,986 A * 10/1992 Wei .................... H10D 30/0316
257/E21.414
(Continued)

FOREIGN PATENT DOCUMENTS

JP 2000332259 A * 11/2000 ......... H01L 27/1288
JP 2016-127190 A 7/2016
(Continued)

*Primary Examiner* — Chad M Dicke
*Assistant Examiner* — Gary Abel
(74) *Attorney, Agent, or Firm* — Womble Bond Dickinson (US) LLP

(57) ABSTRACT

A display apparatus includes: a transistor; a storage capacitor connected to the transistor; and a light-emitting diode electrically connected to the transistor and the storage capacitor, wherein the transistor includes: a gate electrode on a substrate and having a first sub-layer and a second sub-layer on the first sub-layer; and a semiconductor layer having a channel area, a first low-resistance area, and a second low-resistance area, wherein the channel area overlaps the gate electrode, and the first and second low-resistance areas are on both sides of the channel area, a width of the first sub-layer is greater than a width of the second sub-layer, the channel area is arranged along a side surface of the second sub-layer, the storage capacitor includes a first capacitor electrode and a second capacitor electrode, and the first capacitor electrode is on a same layer and includes a same material as the gate electrode.

21 Claims, 12 Drawing Sheets

(51) Int. Cl.
*H10D 86/40* (2025.01)
*H10D 86/60* (2025.01)
*H10K 59/131* (2023.01)

(52) U.S. Cl.
CPC ....... *H10D 30/6755* (2025.01); *H10D 86/423* (2025.01); *H10D 86/443* (2025.01); *H10D 86/481* (2025.01); *H10D 86/60* (2025.01)

(58) Field of Classification Search
CPC ........... H10K 59/1315; H10D 30/6755; H10D 86/423; H10D 86/443; H10D 86/481; H10D 86/60; H10D 30/6715; H10D 30/6739; H10D 86/441; H10D 30/6732; H10D 30/0312; H10D 30/6731; H10D 30/6737; H10D 30/0316; H10D 86/021–0251; H10H 29/142; H01L 2924/30101
See application file for complete search history.

(56) References Cited

U.S. PATENT DOCUMENTS 8,546,803 B2 10/2013 You et al.
9,515,091 B2 12/2016 Hwang et al.
9,679,922 B2 6/2017 Sasaki
10,236,310 B2 3/2019 Park et al.
10,411,046 B2 9/2019 Kim et al.
10,431,641 B2 10/2019 Hwang et al.
10,706,773 B2 * 7/2020 Hanari ................. H10K 50/156
2002/0036288 A1 * 3/2002 Ohnuma ............ H10D 30/6719 257/E29.151
2003/0100151 A1 * 5/2003 Okamoto ........... H10D 30/6745 257/E29.151
2006/0108916 A1 * 5/2006 Koo ....................... H10D 86/60 257/E27.111
2011/0297944 A1 * 12/2011 Choi .................. H10D 30/6739 438/34
2013/0313529 A1 * 11/2013 Kim ................... H10K 59/1216 438/34
2013/0334530 A1 * 12/2013 Katoh ................ H10D 30/6706 257/43
2015/0060814 A1 * 3/2015 Noh ..................... H10D 86/441 438/23
2017/0155000 A1 * 6/2017 Moon ................ H10D 30/6704
2017/0337875 A1 * 11/2017 Jeon ..................... H10D 86/481
2023/0137236 A1 * 5/2023 Lee .................... H10K 59/1213 257/40
2024/0234432 A1 * 7/2024 Sakata ............... H10D 30/6733

FOREIGN PATENT DOCUMENTS

KR 10-2012-0080887 A 7/2012
KR 10-2017-0109114 A 9/2017
KR 10-2018-0039210 A 4/2018
KR 10-2018-0051937 A 5/2018
KR 10-2018-0062278 A 6/2018
KR 10-2020-0037170 A 4/2020
KR 10-2021-0050309 A 5/2021

* cited by examiner 111
107
343
342
341
340
105
104
103
LED
430 420 410
320
321 322 323
250
251 252 253
220
221 222
230
231 232
240
241 242 243
330
331 332 333
M1
M2
210
211 212
200
201 202 203
104OP
Cst
220
250
320
310
311 312 313
300
301 302 303
X
Z

DISPLAY APPARATUS

CROSS-REFERENCE TO RELATED APPLICATION

The present application claims priority to and the benefit of Korean Patent Application No. 10-2022-0000930, filed on Jan. 4, 2022, in the Korean Intellectual Property Office, the entire disclosure of which is incorporated herein by reference.

BACKGROUND

1. Field

Aspects of one or more embodiments relate to a display apparatus.

2. Description of the Related Art

With the rapid development in display fields in which different kinds of electrical signal information are graphically displayed, various display apparatuses having excellent features such as relatively small thickness, relatively light weight, and relatively low power consumption have been introduced.

Display apparatuses may include a liquid crystal display apparatus that utilizes a backlight instead of emitting light by itself or a light-emitting display apparatus including display elements capable of emitting light. The light-emitting display apparatus may include display elements including emission layers.

The above information disclosed in this Background section is only for enhancement of understanding of the background and therefore the information discussed in this Background section does not necessarily constitute prior art.

SUMMARY

Aspects of one or more embodiments relate to a display apparatus, and for example, to a structure related to a light-emitting display apparatus. However, this is merely an example, and the scope of embodiments according to the present disclosure are not limited thereto.

Additional aspects will be set forth in part in the description which follows and, in part, will be apparent from the description, or may be learned by practice of the presented embodiments of the disclosure.

According to some embodiments, a display apparatus includes a thin-film transistor, a storage capacitor electrically connected to the thin-film transistor, and a light-emitting diode electrically connected to the thin-film transistor and the storage capacitor. The thin-film transistor includes a gate electrode arranged on a substrate and including a first sub-layer and a second sub-layer on the first sub-layer, and a semiconductor layer arranged on the gate electrode and including a channel area, a first low-resistance area, and a second low-resistance area, wherein the channel area overlaps the gate electrode, and the first and second low-resistance areas are arranged on both sides of the channel area, a width of the first sub-layer is greater than a width of the second sub-layer, the channel area is arranged along a side surface of the second sub-layer, the storage capacitor includes a first capacitor electrode and a second capacitor electrode on the first capacitor electrode, and the first capacitor electrode is on the same layer and includes the same material as the gate electrode.

According to some embodiments, the first capacitor electrode may include a first capacitor sub-layer including a same material as the first sub-layer; and a second capacitor sub-layer including a same material as the second sub-layer.

According to some embodiments, a thickness of the second sub-layer may be greater than a thickness of the first sub-layer.

According to some embodiments, the first sub-layer may include tail areas extending from a point at which an upper surface of the first sub-layer meets a side surface of the second sub-layer, and a length of each tail area may be equal to or greater than about 1 μm.

According to some embodiments, the gate electrode may be a portion of a first conductive pattern including the first capacitor electrode.

According to some embodiments, the first conductive pattern may include a first portion, which overlaps the second capacitor electrode on a plan view, and a second portion, which protrudes from the first portion in one direction.

According to some embodiments, the storage capacitor may include a connection electrode arranged between and overlapping the first capacitor electrode and the second capacitor electrode, and the connection electrode may be in contact with the second capacitor electrode.

According to some embodiments, the connection electrode may be on the same layer and include the same material as the semiconductor layer.

According to some embodiments, the semiconductor layer may include an oxide semiconductor material.

According to some embodiments, the thin-film transistor may include a first electrode overlapping and electrically connected to any one of the first low-resistance area and the second low-resistance area, and the first electrode may include a tri-layer including a conductive material.

According to some embodiments, a display apparatus includes a substrate, a driving power line extending on the substrate in a first direction, a driving thin-film transistor electrically connected to the driving power line, and a storage capacitor electrically connected to the driving thin-film transistor and including a first capacitor electrode and a second capacitor electrode overlapping the first capacitor electrode, wherein the driving thin-film transistor includes a driving gate electrode including a first sub-layer arranged on the substrate and a second sub-layer arranged on the first sub-layer, a gate insulating layer on the driving gate electrode, and a driving semiconductor layer arranged on the gate insulating layer and including a channel area, a first low-resistance area, and a second low-resistance area, wherein the channel area overlaps the driving gate electrode, and the a first and second low-resistance areas are arranged on both sides of the channel area, a width of the first sub-layer is greater than a width of the second sub-layer, the channel area is arranged along a side surface of the second sub-layer, the first capacitor electrode includes a first capacitor sub-layer, which comprises a same material as the first sub-layer, and a second capacitor sub-layer, which includes a same material as the second sub-layer.

According to some embodiments, at least any one of the first low-resistance area and the second low-resistance area may include an area that does not overlap the driving gate electrode.

According to some embodiments, a vertical distance between an upper surface of the substrate and the first low-resistance area may be different from a vertical distance between the upper surface of the substrate and the second low-resistance area.

According to some embodiments, a portion of the first capacitor electrode may include the driving gate electrode, and the portion of the first capacitor electrode may extend to a lower portion of the driving semiconductor layer to overlap the channel area of the driving semiconductor layer.

According to some embodiments, the display apparatus may further include a data line extending in the first direction, and a switching thin-film transistor electrically connected to the driving thin-film transistor and the data line.

According to some embodiments, the display apparatus may further include a sensing line extending in the first direction, and a sensing thin-film transistor electrically connected to the driving thin-film transistor and the sensing line.

According to some embodiments, a thickness of the second sub-layer may be greater than a thickness of the first sub-layer.

According to some embodiments, the first sub-layer may include tail areas extending from a point at which an upper surface of the first sub-layer meets a side surface of the second sub-layer, and a length of each tail area may be equal to or greater than about 1 μm.

According to some embodiments, the storage capacitor may further include a connection electrode arranged between and overlapping the first capacitor electrode and the second capacitor electrode, and the connection electrode may be in contact with the second capacitor electrode.

According to some embodiments, the connection electrode may be on the same layer and include the same material as the driving semiconductor layer.

BRIEF DESCRIPTION OF THE DRAWINGS

The above and other aspects, features, and characteristics of certain embodiments of the disclosure will be more apparent from the following description taken in conjunction with the accompanying drawings, in which.

DETAILED DESCRIPTION

Figure 1:
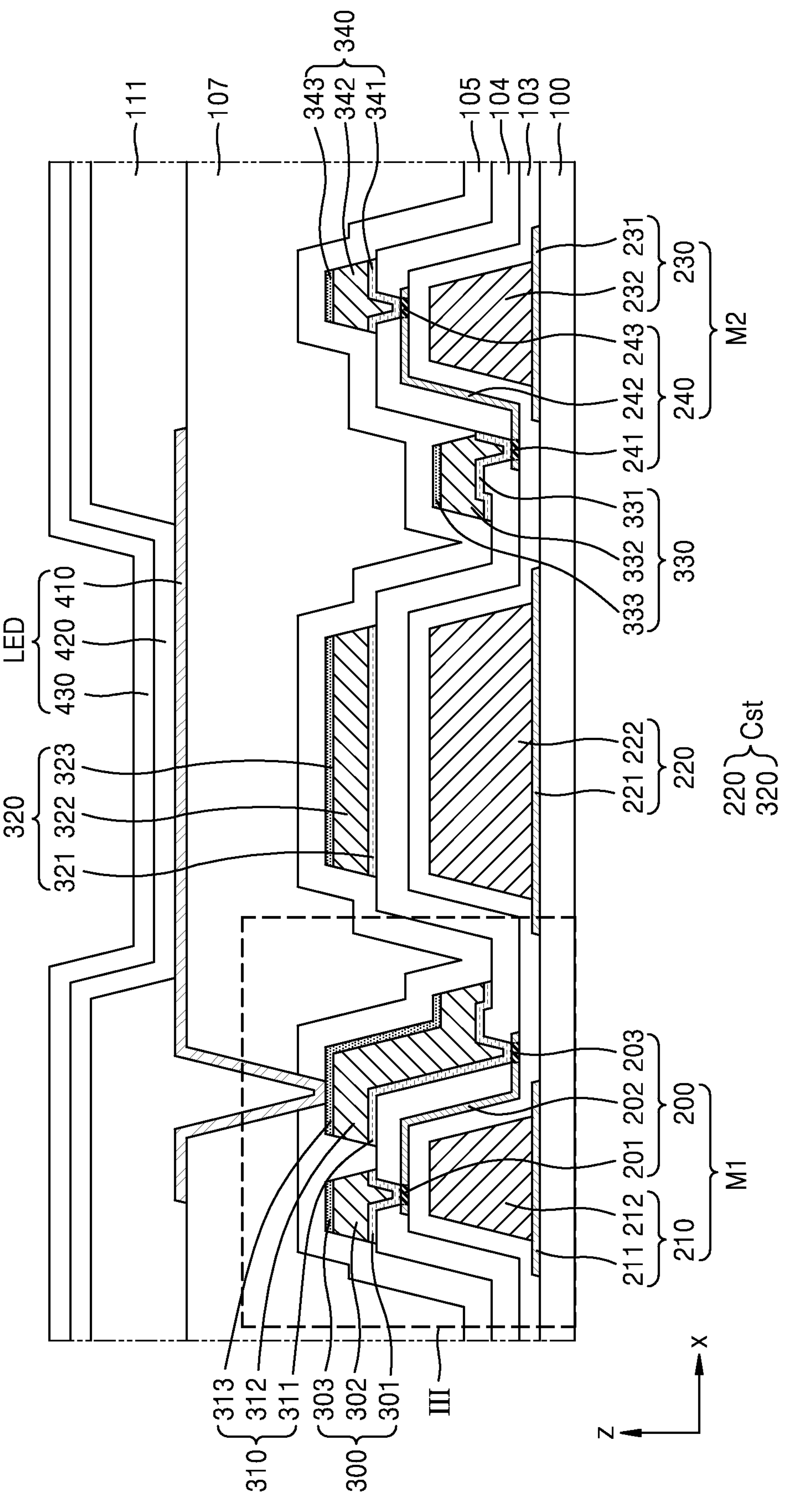
FIG. 1 is a schematic cross-sectional view of a portion of a display apparatus according to some embodiments.

Reference will now be made in more detail to aspects of some embodiments, which are illustrated in the accompanying drawings, wherein like reference numerals refer to like elements throughout. In this regard, the embodiments according to the present disclosure may have different forms and should not be construed as being limited to the descriptions set forth herein. Accordingly, aspects of some embodiments are merely described below, by referring to the figures, to explain aspects of the present description. As used herein, the term “and/or” includes any and all combinations of one or more of the associated listed items. In the present embodiments, an expression such as “a and/or b” indicates a, b, or a and b. Throughout the disclosure, the expression “at least one of a, b, or c” indicates only a, only b, only c, both a and b, both a and c, both b and c, all of a, b, and c, or variations thereof.

As the disclosure allows for various changes and numerous embodiments, aspects of some embodiments will be illustrated in the drawings and described in more detail in the written description. The attached drawings for illustrating embodiments of the present disclosure are referred to in order to gain a sufficient understanding of the present disclosure, the merits thereof, and the objectives accomplished by the implementation of the present disclosure. Embodiments according to the present disclosure may, however, be embodied in many different forms and should not be construed as being limited to the embodiments set forth herein.

It will be understood that although the terms “first,” “second,” etc. may be used herein to describe various components, these components should not be limited by these terms.

As used herein, the singular forms “a,” “an,” and “the” are intended to include the plural forms as well, unless the context clearly indicates otherwise.

It will be further understood that the terms “comprises” and/or “comprising” used herein specify the presence of stated features or components, but do not preclude the presence or addition of one or more other features or components.

It will be understood that when a component, such as a layer, a film, a region, or a plate, is referred to as being “on” another component, the component can be directly on the other component or intervening components may be present thereon.

Sizes of elements in the drawings may be exaggerated for convenience of explanation. In other words, since sizes and thicknesses of elements in the drawings are arbitrarily illustrated for convenience of explanation, the following embodiments are not limited thereto.

In embodiments below, when a wire is being referred to as “extending in a first direction or a second direction,” the wire may extend in a straight line or in a curved line or a zigzag form in the first direction or the second direction.

In embodiments below, the expression “on a plan view” indicates a subject is viewed from the top, and the expression “on a cross-sectional view” indicates a cross-section of a subject, which is vertically cut, is viewed from the side. In the following embodiments, when an element “overlaps” another element, the element may overlap the other element “on a plan view” and “on a cross-sectional view.”

Hereinafter, aspects of one or more embodiments of the present disclosure will be described in detail with reference to the accompanying drawings, and like elements in the drawings denote like elements.

Figure 2:
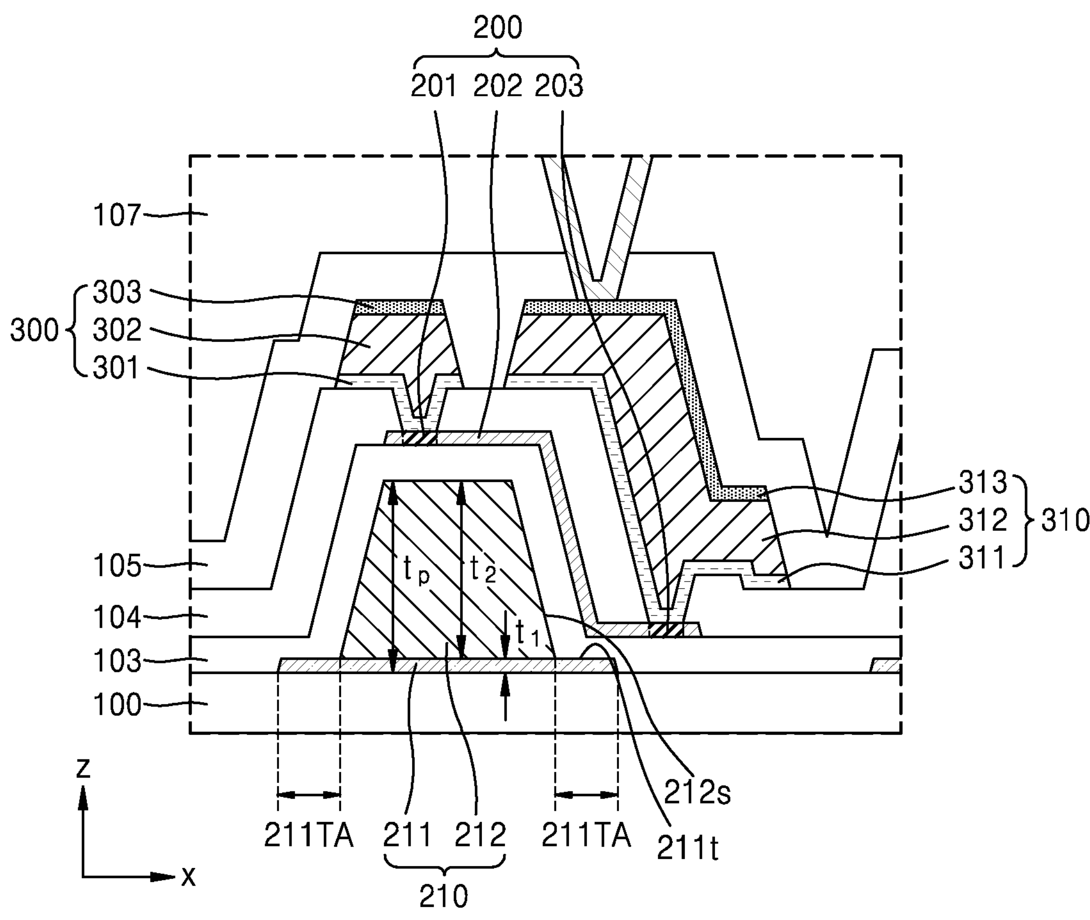
FIG. 2 is a cross-sectional view illustrating an enlarged region III of FIG. 1 according to some embodiments.

FIG. 1 is a schematic cross-sectional view of a portion of a display apparatus according to some embodiments, and FIG. 2 is a cross-sectional view illustrating an enlarged region III of FIG. 1.

Referring to FIGS. 1 and 2, a light-emitting diode LED is arranged on a substrate 100. A sub-pixel circuit electrically connected to the light-emitting diode LED may be arranged between the substrate 100 and the light-emitting diode LED. The sub-pixel circuit may include a plurality of transistors and a storage capacitor. The display apparatus may include a driving thin-film transistor M1 arranged on the substrate 100 and a storage capacitor Cst electrically connected to the driving thin-film transistor M1. Also, as illustrated in FIG. 1, the display apparatus may include a switching thin-film transistor M2 electrically connected to the driving thin-film transistor M1.

The driving thin-film transistor M1 may include a driving gate electrode 210 and a driving semiconductor layer 200 at least partially overlapping the driving gate electrode 210. Also, the switching thin-film transistor M2 may include a switching gate electrode 230 and a switching semiconductor layer 240 at least partially overlapping the switching gate electrode 230. The storage capacitor Cst may include a first capacitor electrode 220 and a second capacitor electrode 320 overlapping the first capacitor electrode 220.

The substrate 100 may include a glass material or a resin material. The glass material may include transparent glass that mainly contains $SiO_x$. The resin material may include polymer resin such as polyethersulphone, polyacrylate, polyetherimide, polyethylene naphthalate, polyethylene terephthalate, polyphenylene sulfide, polyarylate, polyimide, polycarbonate, cellulose triacetate, or cellulose acetate propionate. When the substrate 100 includes the above polymer resin, the substrate 100 may be flexible, rollable, or bendable.

The driving gate electrode 210, the first capacitor electrode 220 of the storage capacitor Cst, and the switching gate electrode 230 may be located on the substrate 100. The first capacitor electrode 220 and the switching gate electrode 230 may be in direct contact with an upper surface of the substrate 100. According to some embodiments, a buffer layer may be further arranged under the first capacitor electrode 220 and the switching gate electrode 230. The buffer layer may include inorganic insulating materials such as silicon nitride, silicon oxynitride, and silicon oxide and may be a layer or layers including the above inorganic insulating materials.

The driving gate electrode 210, the first capacitor electrode 220, and the switching gate electrode 230 may be formed by patterning a preliminary gate electrode layer deposited on the substrate 100. The preliminary gate electrode layer may be formed according to a chemical vapor deposition (CVD) method, a plasma enhanced CVD (PECVD) method, a low pressure CVD (LPCVD) method, a physical vapor deposition (PVD) method, a sputtering method, an atomic layer deposition (ALD) method, or the like.

As illustrated in FIGS. 1 and 2, the driving gate electrode 210, the first capacitor electrode 220, and the switching gate electrode 230, which are formed by patterning the preliminary gate electrode layer, may include first sub-layers 211, 221, and 231 and second sub-layers 212, 222, and 232, respectively.

The first sub-layers 211, 221, and 231 of the driving gate electrode 210, the first capacitor electrode 220, and the switching gate electrode 230 may be coplanar and include the same material. The second sub-layers 212, 222, and 232 of the driving gate electrode 210, the first capacitor electrode 220, and the switching gate electrode 230 may be on corresponding ones of the first sub-layers 211, 221, and 231 and include the same materials.

The first sub-layers 211, 221, and 231 and/or the second sub-layers 212, 222, and 232 may include any suitable electrically conductive material such as aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W) and/or copper (Cu). Alternatively, the driving gate electrode 210 may include a transparent conductive material. The transparent conductive material may include indium tin oxide (ITO), indium zinc oxide (IZO), zinc oxide (ZnO), indium oxide ($In_2O_3$), indium gallium oxide (IGO), or aluminum zinc oxide (AZO).

The first sub-layers 211, 221, and 231 and the second sub-layers 212, 222, and 232 may include different materials. For example, the first sub-layers 211, 221, and 231 and the second sub-layers 212, 222, and 232 may use materials having different etch selectivities. For example, the first sub-layers 211, 221, and 231 may each include Ti, Mo, or a compound thereof, and the second sub-layers 212, 222, and 232 may include a single layer or layers including Cu. However, embodiments according to the present disclsoure are not limited thereto, and the first sub-layers 211, 221, and 231 and the second sub-layers 212, 222, and 232 may include various materials including the aforementioned materials.

A thickness t2 of the second sub-layer 212 of the driving gate electrode 210 may be greater than a thickness t1 of the first sub-layer 211 thereof. The second sub-layer 212 may be a sub-layer occupying most of the driving gate electrode 210. The description that the second sub-layer 212 occupies most of the driving gate electrode 210 may indicate that the thickness t2 of the second sub-layer 212 is equal to or greater than about 50% of the total thickness tp of the driving gate electrode 210 with respect to the center of the second sub-layer 212.

A width of the first sub-layer 211 may be greater than that of the second sub-layer 212. Referring to FIGS. 1 and 2, the first sub-layer 211 may include tail areas 211TA extending from a point at which an upper surface 211*t* of the first sub-layer 211 meets a side surface 212*s* of the second sub-layer 212.

The tail area 211TA of the first sub-layer 211 may be formed by depositing and then partially etching the preliminary driving gate layer. An etching process may be wet etching or dry etching. According to some embodiments, the first sub-layer 211 may be formed through wet etching using an etchant. As described above, because a material of the second sub-layer 212 of the driving gate electrode 210 has a different etch selectivity from a material of the first sub-layer 211, the second sub-layer 212 may be over-etched compared to the first sub-layer 211 during the etching process, and thus, the above-described tail areas 211TA may be formed in the first sub-layer 211 of the driving gate electrode 210. The tail areas 211TA are formed on both sides of the first sub-layer 211 on a cross-sectional view of FIG. 1.

A length of each tail area 211TA may be equal to or greater than about 1 μm. When the length of the tail area 211TA is less than about 1 μm, the first sub-layer 211 may not overlap a portion of a channel area 202, and an electric field may not be easily formed in the channel area 202. In some embodiments, the length of each tail area 211TA may be equal to or greater than about 1 μm and less than or equal to about 2 μm. When a width of the tail area 211TA is greater than about 2 μm, a distance between another wire and the driving gate electrode 210 may decrease, and thus, a short circuit may occur.

The first sub-layer 231 and the second sub-layer 232 of the switching gate electrode 230 may have the same structure as the first sub-layer 211 and the second sub-layer 212 of the driving gate electrode 210 described above. For example, similar to the first sub-layer 211 of the driving gate electrode 210, the first sub-layer 231 of the switching gate electrode 230 may also include tail areas.

The first capacitor electrode 220 of the storage capacitor Cst may have the same structure as the first sub-layer 211 and the second sub-layer 212 of the driving gate electrode 210 described above. For example, the first sub-layer 221 of the first capacitor electrode 220 may also include tail areas.

A gate insulating layer 103 may cover the driving gate electrode 210, the first capacitor electrode 220, and the switching gate electrode 230. The gate insulating layer 103 may include an inorganic insulating material. The inorganic insulating material may be silicon oxide (SiOx), silicon nitride (SiNx), silicon oxynitride (SiON), aluminum oxide ($Al_2O_3$), titanium oxide ($TiO_2$), tantalum oxide ($Ta_2O_5$), hafnium oxide ($HfO_2$), or zinc oxide (ZnOx) and may be formed according to a deposition method such as CVD or sputtering, but embodiments according to the present disclosure are not limited thereto.

The gate insulating layer 103 including the inorganic insulating material may extend according to shapes of the driving gate electrode 210, the first capacitor electrode 220, and the switching gate electrode 230 arranged under the gate insulating layer 103. In other words, an upper surface of the gate insulating layer 103 may not be on a plane (e.g., a planar surface) parallel to the upper surface of the substrate 100 and may include a surface including uneven portions.

The driving semiconductor layer 200 and the switching semiconductor layer 240 may be arranged on the gate insulating layer 103.

The driving semiconductor layer 200 and the switching semiconductor layer 240 may be formed by depositing and patterning a preliminary semiconductor layer. The driving semiconductor layer 200 may include the same material as the switching semiconductor layer 240. For example, the driving semiconductor layer 200 and the switching semiconductor layer 240 may include oxide semiconductor materials. The oxide semiconductor materials may include indium gallium zinc oxide (IGZO), zinc tin oxide (ZTO), zinc indium oxide (ZIO), and the like.

According to some embodiments, the driving semiconductor layer 200 and/or the switching semiconductor layer 240 may include amorphous silicon or polysilicon.

Hereinafter, it is described that the driving semiconductor layer 200 and the switching semiconductor layer 240 are oxide semiconductors.

The driving semiconductor layer 200 may include a first low-resistance area 201 and a second low-resistance area 203, and the channel area 202 may be located between the first low-resistance area 201 and the second low-resistance area 203. The first low-resistance area 201 and the second low-resistance area 203 may have less resistance than the channel area 202 and may be formed through an impurity doping process or a conducting process. One of the first low-resistance area 201 and the second low-resistance area 203 may be a drain area, and the other thereof may be a source area.

According to some embodiments, at least any one of the first low-resistance area 201 and the second low-resistance area 203 may include an area that does not overlap the driving gate electrode 210. For example, as illustrated in FIG. 1, the first low-resistance area 201 may entirely overlap the driving gate electrode 210, but the second low-resistance area 203 may include an area that does not overlap the driving gate electrode 210, for example, the first sub-layer 211.

According to some embodiments, a vertical distance from the upper surface of the substrate 100 to the first low-resistance area 201 may be different from a vertical distance from the upper surface of the substrate 100 to the second low-resistance area 203. In other words, the first low-resistance area 201 and the second low-resistance area 203 may be at different levels. According to some embodiments, the vertical distance from the upper surface of the substrate 100 to the first low-resistance area 201 may be greater than the vertical distance from the upper surface of the substrate 100 to the second low-resistance area 203.

The channel area 202 of the driving semiconductor layer 200 may be arranged along the side surface **212*s* of the second sub-layer 212. In other words, the channel area 202 of the driving semiconductor layer 200 may extend substantially in parallel with the side surface 212*s* along the side surface 212*s* of the second sub-layer 212. A space occupied by the driving semiconductor layer 200 on the substrate 100** may be effectively used because of the above structure.

As a comparative example, when a channel area of a semiconductor layer is horizontally arranged, there may be a spatial limitation on realizing a high-resolution panel according to a length of the channel area of the semiconductor layer. Also, the panel may be bent to a relatively low extent.

However, according to some embodiments of the disclosure, the channel area 202 of the driving semiconductor layer 200 is arranged along the side surface **212*s* of the second sub-layer 212 having a certain thickness. In other words, as the channel area 202 is arranged in a gradient direction having a certain angle to the substrate 100, a width of or an area occupied by a thin-film transistor may be reduced in a direction (e.g., an x direction of FIG. 1) parallel to the upper surface of the substrate 100**. Therefore, it may be possible to realize a high-resolution panel or a flexible panel.

Similarly, the switching semiconductor layer 240 may include a first low-resistance area 241 and a second low-resistance area 243, and a channel area 242 may be located between the first low-resistance area 241 and the second low-resistance area 243. The first low-resistance area 241, the second low-resistance area 243, and the channel area 242 of the switching semiconductor layer 240 may have the same configuration as the arrangement of the driving semiconductor layer 200 overlapping the above driving gate electrode 210 with respect to the switching gate electrode 230.

An interlayer insulating layer 104 may be arranged on the driving semiconductor layer 200 and the switching semiconductor layer 240. The interlayer insulating layer 104 may include an inorganic insulating material such as SiOx, SiNx, or SiON. The interlayer insulating layer 104 may be a layer or layers including the above material. The interlayer insulating layer 104 may be an insulating layer including an inorganic insulating material and formed according to a deposition method such as CVD or ALD. However, embodiments according to the present disclosure are not limited thereto.

The interlayer insulating layer 104 may include contact holes overlapping the driving semiconductor layer 200 and the switching semiconductor layer 240. Some portions of the driving semiconductor layer 200 and the switching semiconductor layer 240, which are exposed through the contact holes, may become conductive through a plasma process, etc. Accordingly, as described above, the driving semiconductor layer 200 may include the first low-resistance area 201 and the second low-resistance area 203. Similarly, the switching semiconductor layer 240 may include the first low-resistance area 241 and the second low-resistance area 243.

A plasma process is to chemically or physically reform a surface of a material as particles having high energy in a plasma state collide with the surface of the material. According to some embodiments, during the plasma process, at least one gas selected from the group consisting of hydrogen gas, argon gas, helium gas, xenon gas, nitrogen gas, nitrogen oxide gas, oxygen gas, and a mixture thereof may be used.

When an oxide semiconductor is plasma-processed, the oxide semiconductor is reduced, and thus, oxygen deficiency in the oxide semiconductor is induced so that oxygen vacancy increases. In the oxide semiconductor with the increased oxygen vacancy, the carrier concentration increases, and a concentration of a threshold voltage, at which electricity flows, from among semiconductor characteristics moves in a negative direction. The above description may indicate that the oxide semiconductor becomes conductive, and thus, the electricity flows therein well.

A first electrode 300, a second electrode 310, a third electrode 330, and a fourth electrode 340 may be arranged on the interlayer insulating layer 104. The first electrode 300 may be in contact with the first low-resistance area 201 of the driving semiconductor layer 200 through the contact hole, and the second electrode 310 may be in contact with the second low-resistance area 203 of the driving semiconductor layer 200 through the contact hole. According to some embodiments, when the first low-resistance area 201 is a drain (or source) area and the second low-resistance area 203 is a source (or drain) area, the first electrode 300 may be a drain (or source) electrode, and the second electrode 310 may be a source (or drain) electrode.

Similarly, the third electrode 330 may be in contact with the first low-resistance area 241 of the switching semiconductor layer 240 through the contact hole, and the fourth electrode 340 may be in contact with the second low-resistance area 243 of the switching semiconductor layer 240 through the contact hole. According to some embodiments, when the first low-resistance area 241 is a drain (or source) area and the second low-resistance area 243 is a source (or drain) area, the third electrode 330 may be a drain (or source) electrode, and the fourth electrode 340 may be a source (or drain) electrode.

The first electrode 300, the second electrode 310, the third electrode 330, and the fourth electrode 340 may be arranged to be spaced apart from each other and formed by patterning the preliminary electrode layer deposited on the substrate 100.

The first electrode 300, the second electrode 310, the third electrode 330, and the fourth electrode 340 may each have a multilayered structure. The first electrode 300, the second electrode 310, the third electrode 330, and the fourth electrode 340 may each have a three-layer structure including first electrode layers 301, 311, 331, and 341, second electrode layers 302, 312, 332, and 342, and third electrode layers 303, 313, 333, and 343.

The first electrode layers 301, 311, 331, and 341 of the first electrode 300, the second electrode 310, the third electrode 330, and the fourth electrode 340 may include the same material and have substantially the same thickness. The second electrode layers 302, 312, 332, and 342 of the first electrode 300, the second electrode 310, the third electrode 330, and the fourth electrode 340 may include the same material and have substantially the same thickness. The third electrode layers 303, 313, 333, and 343 of the first electrode 300, the second electrode 310, the third electrode 330, and the fourth electrode 340 may include the same material and have the same or substantially (e.g., within manufacturing tolerances) the same thickness.

The first electrode layers 301, 311, 331, and 341, the second electrode layers 302, 312, 332, and 342, and the third electrode layers 303, 313, 333, and 343 may include conductive materials. The first electrode layers 301, 311, 331, and 341, the second electrode layers 302, 312, 332, and 342, and/or the third electrode layers 303, 313, 333, and 343 may include conductive materials including Al, Pt, Pd, Ag, Mg, Au, Ni, Nd, Ir, Cr, Li, Ca, Mo, Ti, W, and/or Cu or transparent conductive materials. The transparent conductive material may include, for example, conductive oxide such as ITO, IZO, ZnO, $In_2O_3$, IGO, or AZO.

Two electrode layers or three electrode layers selected from among the first electrode layers 301, 311, 331, and 341, the second electrode layers 302, 312, 332, and 342, and the third electrode layers 303, 313, 333, and 343 of the first electrode 300, the second electrode 310, the third electrode 330, and the fourth electrode 340 may include different materials.

The first electrode 300 may overlap the first low-resistance area 201 and a peripheral portion of the driving semiconductor layer 200, but the second electrode 310 may extend to overlap the second low-resistance area 203 of the driving semiconductor layer 200 and most portions of the channel area 202, for example, portions close to the first low-resistance area 201. In this case, the operation of the driving thin-film transistor M1 may be stabilized. For example, a saturation area in an IV curve of a transistor may be stabilized. However, one or more embodiments are not limited thereto. In some embodiments, the second electrode 310 may be arranged to overlap the second low-resistance area 203 and a peripheral portion of the driving semiconductor layer 200.

On the contrary, the third electrode 330 of the switching thin-film transistor M2 may be arranged to overlap the first low-resistance area 241 and a peripheral portion of the switching semiconductor layer 240. Also, the fourth electrode 340 may be arranged to overlap the second low-resistance area 243 and a peripheral portion.

A passivation layer 105 may be arranged on the first electrode 300, the second electrode 310, the third electrode 330, and the fourth electrode 340. The passivation layer 105 may cover and protect the first electrode 300, the second electrode 310, the third electrode 330, and the fourth electrode 340. The passivation layer 105 may include an inorganic insulating material. The inorganic insulating material may include SiOx, SiNx, SiON, $Al_2O_3$, $TiO_2$, $Ta_2O_5$, $HfO_2$, ZnOx, or the like and may be formed through CVD, sputtering, or the like.

A planarization layer 107 may be arranged on the passivation layer 105. When the planarization layer 107 includes an organic layer, an upper surface of the planarization layer 107 may be planar despite a step difference in a lower portion of the planarization layer 107.

The planarization layer 107 may include an inorganic insulating material or an organic insulating material such as polyacrylates resin, epoxy resin, phenolic resin, polyamides resin, polyimides rein, unsaturated polyesters resin, poly phenylenethers resin, polyphenylenesulfides resin, or benzocyclobutene (BCB). The planarization layer 107 may be a layer or layers including the above material.

A light-emitting diode LED may be arranged on the planarization layer 107. The light-emitting diode LED may include a sub-pixel electrode 410, an emission layer 420 including an organic material, and an opposite electrode 430. According to some embodiments, the light-emitting diode LED may be an organic light-emitting diode including an organic material.

The sub-pixel electrode 410 may include transparent conductive oxide (TCO) such as ITO, IZO, ZnO, $In_2O_3$, IGO, or AZO. According to some embodiments, the sub-pixel electrode 410 may include a reflection layer including Mg, Ag, Al, Pt, Pd, Au, Ni, Nd, Ir, Cr, or a compound thereof. According to some embodiments, the sub-pixel electrode 410 may further include a layer including ITO, IZO, ZnO, or $In_2O_3$ on/under the reflection layer. For example, the sub-pixel electrode 410 may have a three-layer structure including an ITO layer, an Ag layer, and an ITO layer.

A bank layer 111 including an opening exposing a portion of the sub-pixel electrode 410 may be arranged on the sub-pixel electrode 410, and the emission layer 420 and the opposite electrode 430 may be arranged to overlap the sub-pixel electrode 410 through the opening of the bank layer 111.

The emission layer 420 may include a high-molecular-weight or low-molecular-weight organic material emitting blue light. The emission layer 420 may entirely cover the substrate 100. The opposite electrode 430 may entirely cover the substrate 100.

The opposite electrode 430 may be a semi-transmissive electrode or a transmissive electrode. The opposite electrode 430 may be a semi-transmissive electrode including an ultra-thin metal including Mg, Ag, Al, Pt, Pd, Au, Ni, Nd, Ir, Cr, or a compound thereof. The opposite electrode 430 may include TCO such as ITO, IZO, ZnO, $In_2O_3$, IGO, or AZO.

Figure 3A:
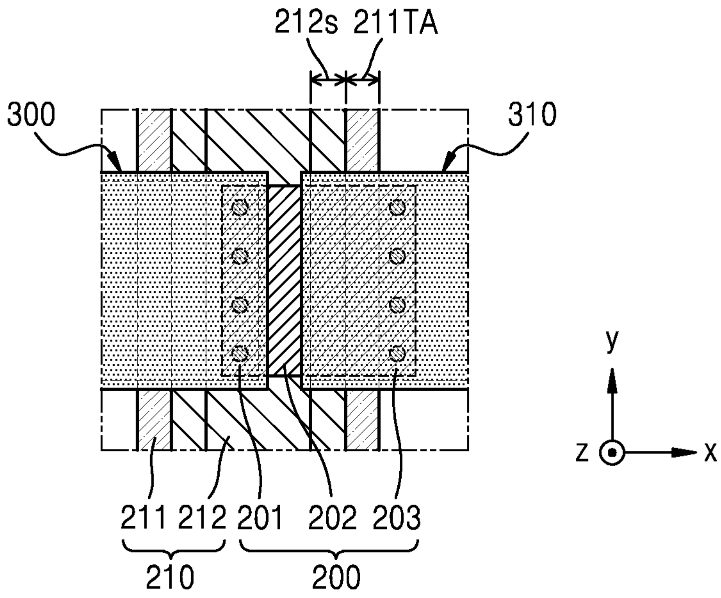
FIGS. 3A to 3C are schematic plan views of a portion of a display apparatus according to some embodiments.
Figure 3B:
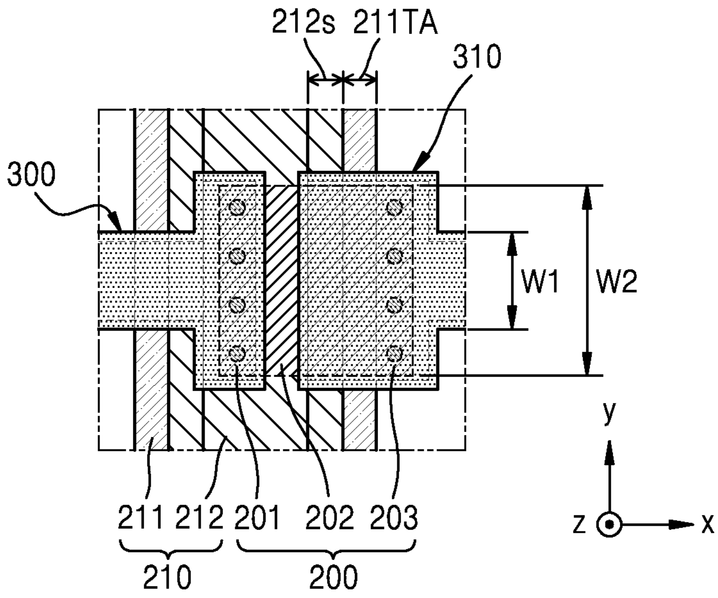
Figure 3C:
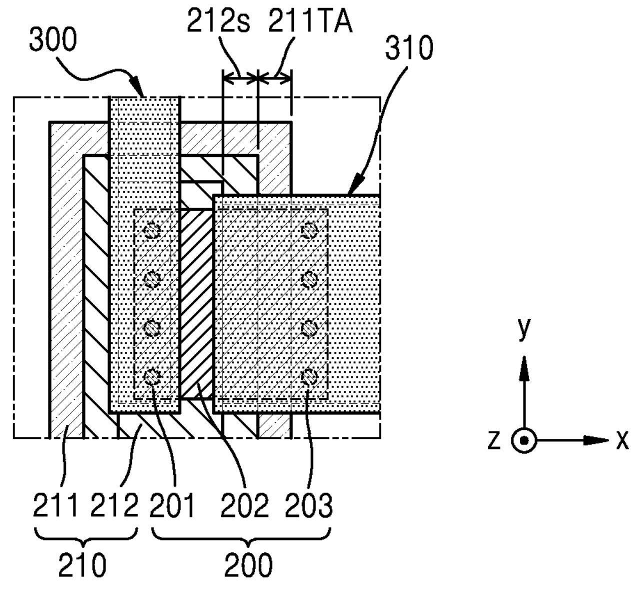

FIGS. 3A to 3C are schematic plan views of a display apparatus according to some embodiments and plan views of an overlapping structure of the driving gate electrode 210, the driving semiconductor layer 200, the first electrode 300, and the second electrode 310.

Referring to FIGS. 3A to 3C, a planar shape or a wire direction of the first electrode 300 or the second electrode 310 may change to reduce a parasitic capacitance that may be generated in a region where the first electrode 300 or the second electrode 310 unnecessarily overlaps the driving gate electrode 210.

Referring to FIGS. 3A and 3B, according to some embodiments, the first electrode 300 or the second electrode 310, for example, the first electrode 300, may overlap the driving gate electrode 210 and may include some portions that do not overlap the driving semiconductor layer 200. A length W1 of some portions of the first electrode 300 in a y direction may be less than a length of a portion of the first electrode 300 overlapping the driving semiconductor layer 200 in the y direction. For example, the length W1 of some portions of the first electrode 300 in the y direction may be less than a length W2 of the driving semiconductor layer 200 in the y direction. Accordingly, an area of an overlapping area where the first electrode 300 overlaps the driving gate electrode 210 may decrease.

Referring to FIG. 3C, according to some embodiments, the driving semiconductor layer 200, the first electrode 300, and the second electrode 310 may be arranged adjacent to an end portion of the driving gate electrode 210. In this case, a wire of the first electrode 300 may be arranged in the y direction towards the end portion of the driving gate electrode 210. A wire direction of the first electrode 300 may be perpendicular to a direction (an x direction) of the channel area 202 of the driving semiconductor layer 200. Accordingly, the area of the overlapping area where the first electrode 300 overlaps the driving gate electrode 210 may decrease, and the parasitic capacitance may decrease.

Figure 4:
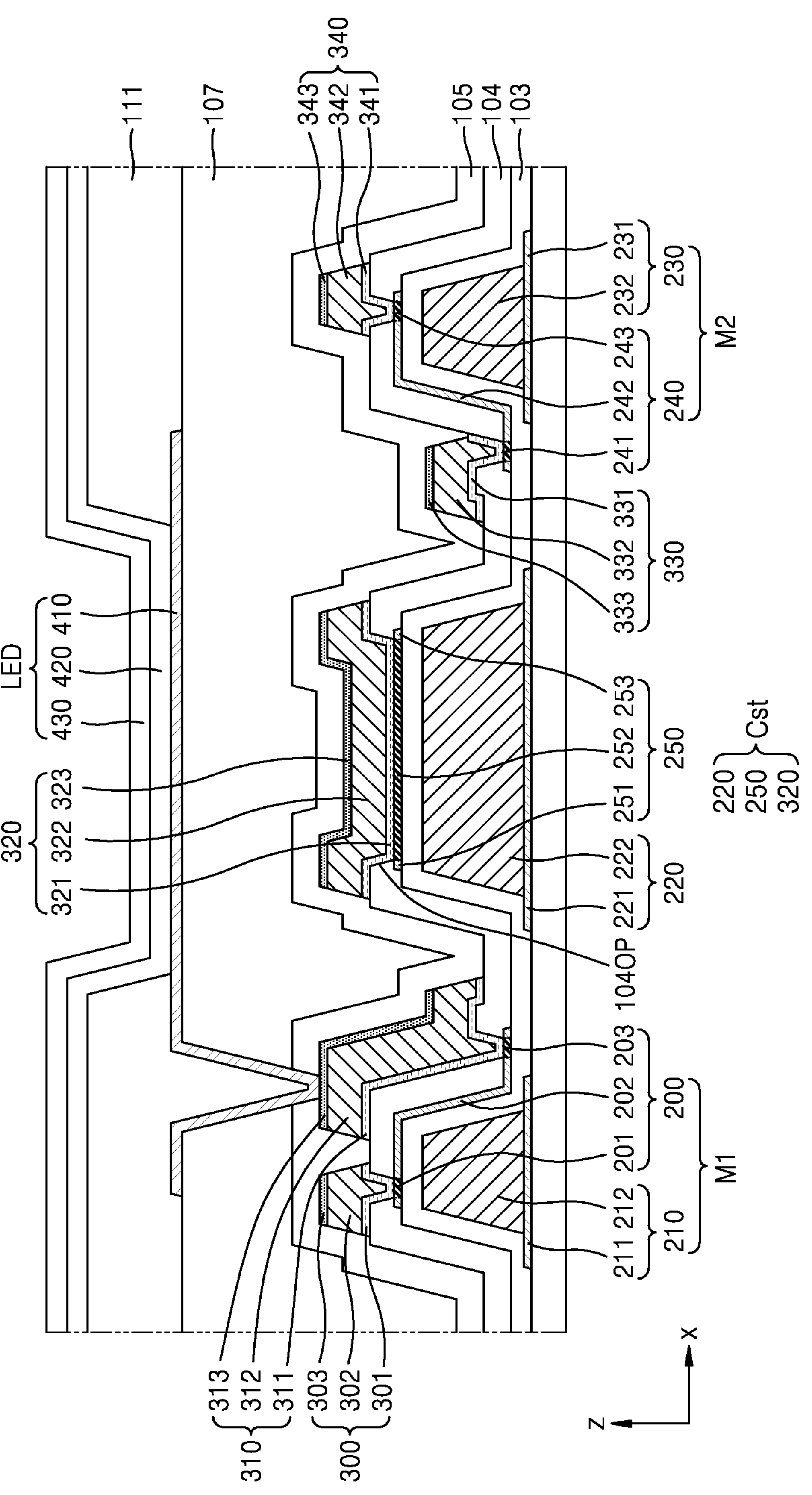
FIG. 4 is a schematic cross-sectional view of a portion of a display apparatus according to some embodiments.

FIG. 4 is a schematic cross-sectional view of a portion of a display apparatus according to some embodiments. The display apparatus may include the driving thin-film transistor M1 arranged on the substrate 100 and the storage capacitor Cst electrically connected to the driving thin-film transistor M1. Also, the display apparatus may include the switching thin-film transistor M2 electrically connected to the driving thin-film transistor M1.

Referring to FIG. 4, the storage capacitor Cst may further include a connection electrode 250 arranged between the first capacitor electrode 220 and the second capacitor electrode 320 and overlapping the same.

The connection electrode 250 may be arranged on the gate insulating layer 103. The connection electrode 250 may be on the same layer and include the same material as the driving semiconductor layer 200 and the switching semiconductor layer 240. The connection electrode 250 may include an oxide semiconductor material, for example, IGZO, ZTO, or ZIO.

The interlayer insulating layer 104 may include an opening 1040P exposing portions of the connection electrode 250 and may be arranged to cover both ends of the connection electrode 250. Some portions of the connection electrode 250, which are exposed through the opening 1040P of the interlayer insulating layer 104, may become conductive through a plasma processing, etc. Accordingly, the connection electrode 250 may include a low-resistance area 252 that becomes conductive. Both end portions 251 and 253 of the connection electrode 250 protected by the interlayer insulating layer 104 may not be conductive.

The second capacitor electrode 320 may be arranged on the interlayer insulating layer 104. The second capacitor electrode 320, for example, the first sub-layer 321 of the second capacitor electrode 320, may be in contact with the connection electrode 250 through the opening 1040P. The connection electrode 250 may function as an upper electrode of the storage capacitor Cst together with the second capacitor electrode 320.

When the storage capacitor Cst does not include the connection electrode 250, for example, the gate insulating layer 103 and the interlayer insulating layer 104 may be arranged between the first capacitor electrode 220 and the second capacitor electrode 320, as illustrated in FIG. 1.

On the contrary, when the storage capacitor Cst includes the connection electrode 250, the gate insulating layer 103 may only be arranged between the connection electrode 250 and the first capacitor electrode 220. Therefore, a thickness of an insulating layer between capacitor electrodes may decrease. In this case, the same capacitor capacity may be secured in a relatively small electrode area.

The driving thin-film transistor M1, the switching thin-film transistor M2, and the storage capacitor Cst described with reference to FIGS. 1 to 4 may be applied to a display apparatus according to some embodiments below.

Figure 5:
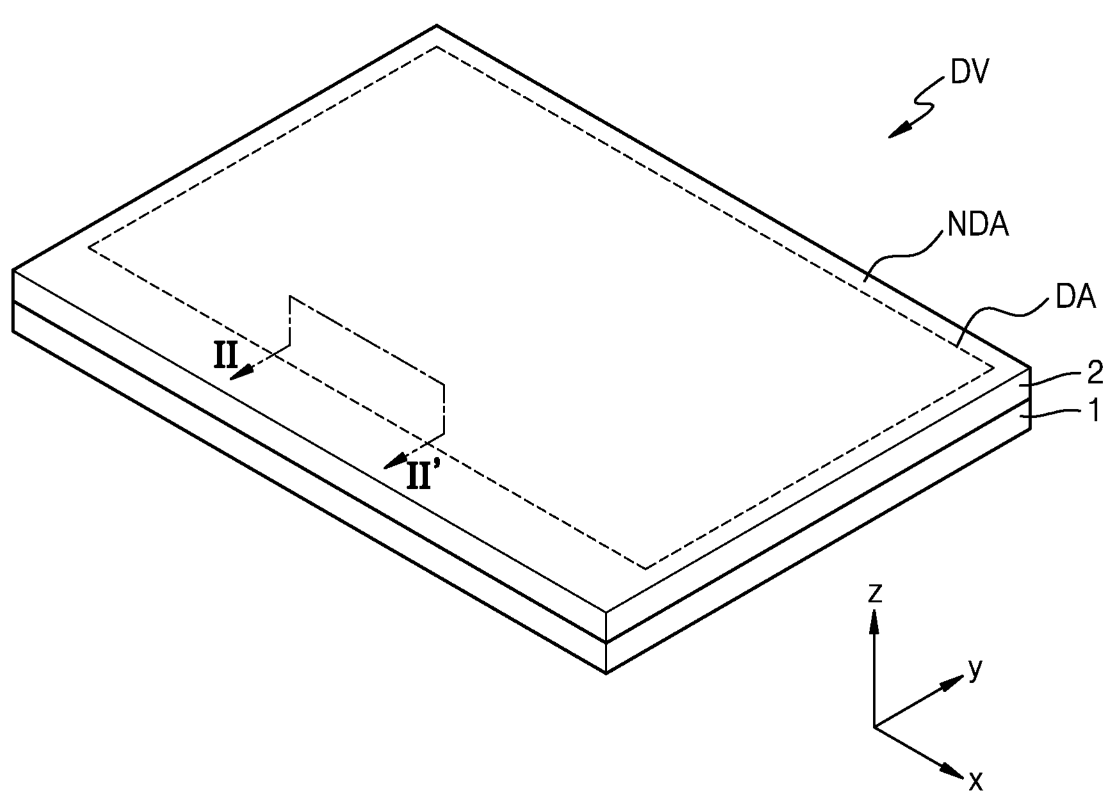
FIG. 5 is a schematic perspective view of a display apparatus according to some embodiments.
Figure 6:
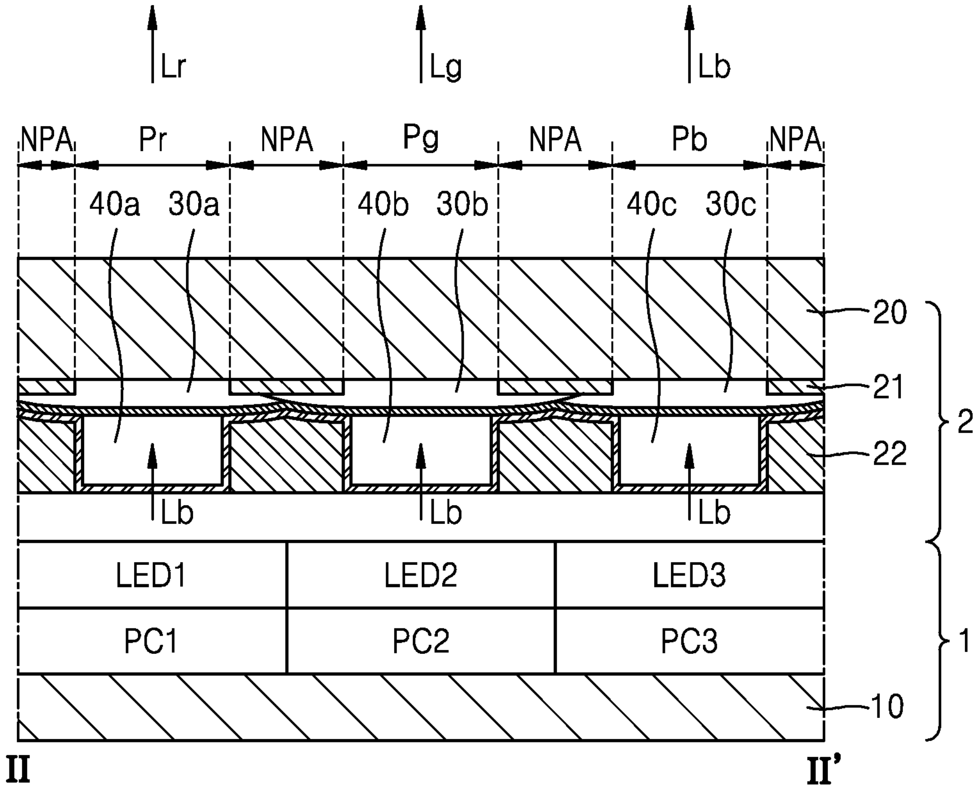
FIG. 6 is a cross-sectional view of a display apparatus taken along the line II-II' of FIG. 5 according to some embodiments.
Figure 6:
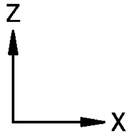
Figure 7:
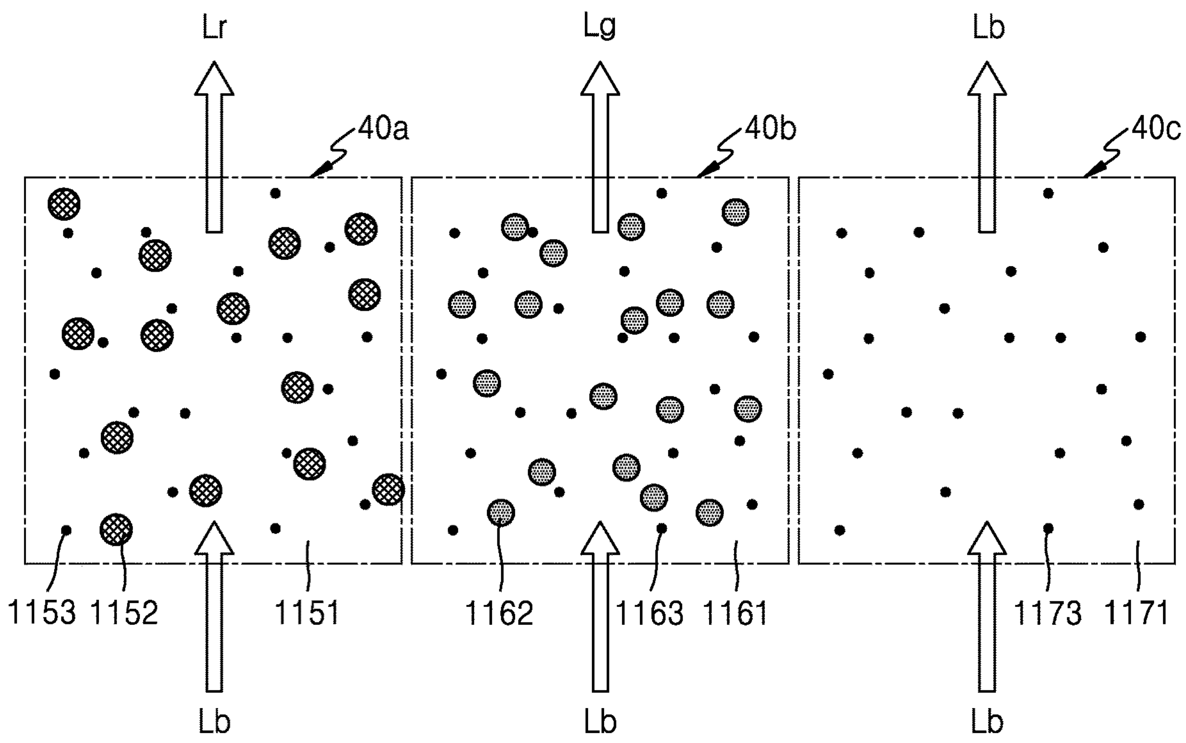
FIG. 7 illustrates respective portions of a color conversion-transmission layer of FIG. 5 according to some embodiments.

FIG. 5 is a schematic perspective view of a display apparatus according to some embodiments, FIG. 6 is a cross-sectional view of a display apparatus, taken along the line II-II' of FIG. 5, and FIG. 7 illustrates respective portions of a color conversion-penetration layer of FIG. 6.

Referring to FIG. 5, a display apparatus DV may include a display area DA and a non-display area NDA outside the display area DA. The display apparatus DV may provide an image through an array of a plurality of sub-pixels that are two-dimensionally arranged.

Each sub-pixel of the display apparatus DV may be an area where light of a certain color may be emitted, and the display apparatus DV may display images by using light emitted from the sub-pixels. For example, each sub-pixel may emit red light, green light, or blue light.

The non-display area NDA may be an area where no images displayed and may entirely surround the display area DA. That is, the non-display area NDA may be in a periphery or outside a footprint of the display area DA. In the non-display area NDA, drivers or main power lines for providing electrical signals or power to sub-pixel circuits may be arranged. In the non-display area NDA, a pad that may be electrically connected to an electronic component or a printed circuit board may be included.

As illustrated in FIG. 5, the display area DA may have a polygonal shape including a rectangular shape. For example, the display area DA may have a rectangular shape in which a horizontal length is greater than a vertical length, a rectangular shape in which the horizontal length is less than the vertical length, or a square shape. Alternatively, the display area DA may have various shapes such as an oval shape or a circular shape.

Referring to FIG. 5, the display apparatus DV may include an emission panel 1 and a color panel 2 stacked in a thickness direction (e.g., a z direction). The emission panel 1 may include first to third sub-pixel circuits PC1 to PC3 arranged on a first substrate 10 and first to third light-emitting diodes LED1 to LED3 respectively connected to the first to third sub-pixel circuits PC1 to PC3.

The light (e.g., blue light Lb) emitted from the first to third light-emitting diodes LED1 to LED3 may pass through the color panel 2 and thus may be converted into red light Lr, green light Lg, and blue light Lb or may penetrate. An area where the red light Lr is emitted may be a red sub-pixel Pr, an area where the green light Lg is emitted may be a green sub-pixel Pg, and an area where the blue light Lb is emitted may be a blue sub-pixel Pb.

The color panel 2 may include a second substrate 20 and a first light-shield layer 21 on the second substrate 20. The first light-shield layer 21 may include a plurality of holes formed as portions corresponding to the red sub-pixel Pr, the green sub-pixel Pg, and the blue sub-pixel Pb are removed. The first light-shield layer 21 may include a material portion located in a non-sub-pixel area NPA, and the material portion may include various materials capable of absorbing light.

A second light-shield layer 22 may be arranged on the first light-shield layer 21. The second light-shield layer 22 may also include a material portion located in the non-sub-pixel area NPA. The second light-shield layer 22 may include various materials capable of absorbing light. The second light-shield layer 22 may include the same material as or a different material from the first light-shield layer 21.

The first light-shield layer 21 and/or the second light-shield layer 22 may include an opaque inorganic insulating material such as chromium oxide or molybdenum oxide, or an opaque organic insulating material such as black resin.

A color layer including first to third color filters 30*a* to 30*c* may be arranged on the second substrate 20. The first color filter 30*a* may include a dye or a pigment having a first color (e.g., red). The second color filter 30*b* may include a dye or a pigment having a second color (e.g., green). The third color filter 30*c* may include a dye or a pigment having a third color (e.g., blue).

A color conversion-penetration layer including a first color conversion part 40*a*, a second color conversion part 40*b*, and a penetration part 40*c* may be arranged between the color layer and light-emitting diodes.

The first color conversion part 40*a* may overlap the first color filter 30*a* and may convert incident blue light Lb into the red light Lr. As illustrated in FIG. 7, the first color conversion part 40*a* may include a first photosensitive polymer 1151 and first quantum dots 1152 and first scattered particles 1153 that are spread on the first photosensitive polymer 1151.

The first quantum dots 1152 may be excited by the blue light Lb and isotropically emit the red light Lr having a greater wavelength than the blue light Lb. The first photosensitive polymer 1151 may include an organic material that is light-transmissive.

The first scattered particles 1153 may increase the color conversion efficiency by scattering the blue light Lb, which has not yet been absorbed into the first quantum dots 1152, to make more first quantum dots 1152 be excited. The first scattered particles 1153 may be, for example, titanium oxide ($TiO_2$) or metal particles. The first quantum dots 1152 may be selected from among II-VI group compounds, III-V group compounds, IV-VI group compounds, IV group elements, IV group compounds, and a combination thereof.

The second color conversion part 40*b* may overlap the second color filter 30*b* and convert incident blue light Lb into the green light Lg. As illustrated in FIG. 7, the second color conversion part 40*b* may include a second photosensitive polymer 1161 and second quantum dots 1162 and second scattered particles 1163 that are spread on the second photosensitive polymer 1161.

The second quantum dots 1162 may be excited by the blue light Lb and isotropically emit the green light Lg having a greater wavelength than the blue light Lb. The second photosensitive polymer 1161 may include an organic material that is light-transmissive. The second scattered particles 1163 may increase the color conversion efficiency by scattering the blue light Lb, which has not yet been absorbed into the second quantum dots 1162, to make more second quantum dots 1162 be excited. The second scattered particles 1163 may be, for example, $TiO_2$ or metal particles. The second quantum dots 1162 may be selected from among II-VI group compounds, III-V group compounds, IV-VI group compounds, IV group elements, IV group compounds, and a combination thereof. The second quantum dots 1162 may include the same material as the first quantum dots 1152, and in this case, sizes of the second quantum dots 1162 may be greater than those of the first quantum dots 1152.

The penetration part 40*c* may transmit the blue light Lb. As illustrated in FIG. 7, the penetration part 40*c* may include a third photosensitive polymer 1171 on which third scattered particles 1173 are spread. The third photosensitive polymer 1171 may be an organic material, for example, silicon resin, epoxy resin, etc., which has light transmittance and may include the same material as the first and second photosensitive polymers 1151 and 1161. The third scattered particles 1173 may scatter and emit the blue light Lb and include the same material as the first and second scattered particles 1153 and 1163.

The blue light Lb emitted from the emission panel 1, of which a color is converted by the color conversion-penetration layer and transmitted, may pass through the color layer and thus may have improved color purity. For example, the blue light Lb emitted from the first light-emitting diode LED1 of the emission panel 1 may transmit a first color region of the color panel 2. While passing through the color panel 2, the blue light Lb may be converted into the red light Lr and filtered by the color panel 2. The first color region may have a stack structure of the first color conversion part 40*a* and the first color filter 30*a*.

The blue light Lb emitted from the second light-emitting diode LED2 of the emission panel 1 may pass through a second color region of the color panel 2. While passing through the color panel 2, the blue light Lb may be converted into the green light Lg and filtered by the color panel 2. The second color region may have a stack structure of the second color conversion part 40*b* and the second color filter 30*b*.

The blue light Lb emitted from the third light-emitting diode LED3 of the emission panel 1 may pass through a third color region of the color panel 2. While passing through the color panel 2, the blue light Lb may penetrate and may be filtered by the color panel 2. The third color region may have a stack structure of the penetration part 40*c* and the third color filter 30*c*.

The first to third light-emitting diodes LED1 to LED3 may include organic light-emitting diodes including organic materials. In some embodiments, the first to third light-emitting diodes LED1 to LED3 may include inorganic light-emitting diodes including inorganic materials. According to some embodiments, the first to third light-emitting diodes LED1 to LED3 may be light-emitting diodes including quantum dots. As described above, the emission layers of the first to third light-emitting diodes LED1 to LED3 may include organic materials, inorganic materials, quantum dots, both organic materials and quantum dots, or both inorganic materials and quantum dots.

The display apparatus DV having the above structure may include a mobile phone, a television (TV), a billboard, a monitor, a tablet personal computer (PC), a laptop, or the like.

Figure 8:
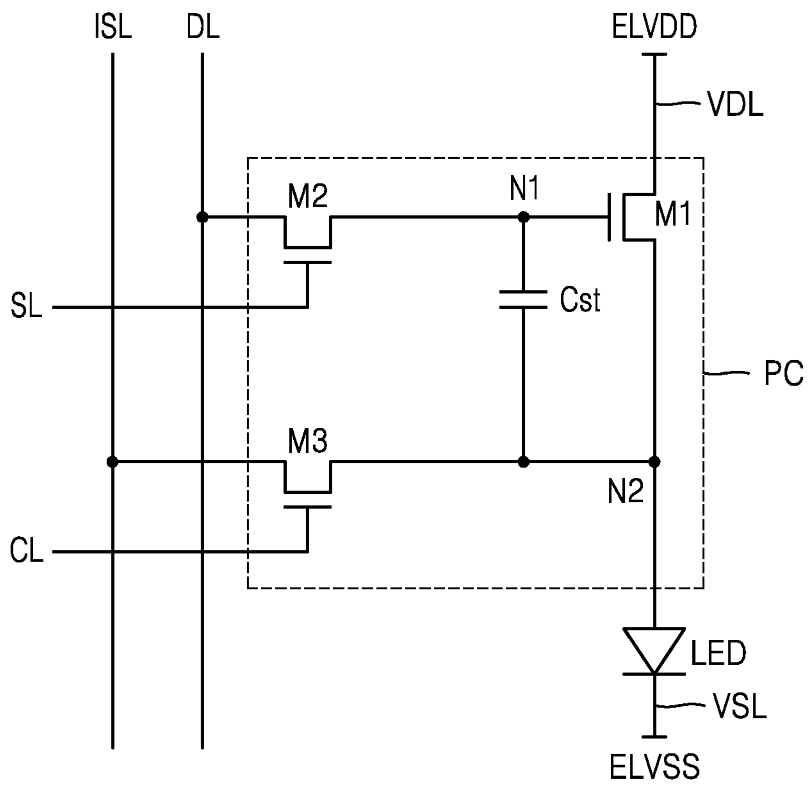
FIG. 8 is an equivalent circuit diagram of a light-emitting diode included in a display apparatus, and a sub-pixel circuit electrically connected to the light-emitting diode, according to some embodiments.

FIG. 8 is an equivalent circuit diagram of a light-emitting diode included in a display apparatus and a sub-pixel circuit electrically connected to the light-emitting diode, according to some embodiments.

Referring to FIG. 8, a light-emitting diode, for example, a pixel electrode (e.g., an anode) of the light-emitting diode LED, may be connected to the sub-pixel circuit PC, and an opposite electrode (e.g., a cathode) of the light-emitting diode LED may be connected to a common voltage line VSL configured to provide a common power voltage ELVSS. The light-emitting diode LED may emit light having brightness corresponding to the amount of current provided from the sub-pixel circuit PC.

The light-emitting diodes LED of FIG. 8 may respectively correspond to the first to third light-emitting diodes LED1 to LED3 illustrated in FIG. 6, and the sub-pixel circuits PC of FIG. 8 may respectively correspond to the first to third sub-pixel circuits PC1 to PC3 illustrated in FIG. 6.

The sub-pixel circuit PC may control the amount of current flowing to the common power voltage ELVSS from a driving power voltage ELVDD via the light-emitting diode LED, in response to a data signal. The sub-pixel circuit PC may include the driving thin-film transistor M1, the switching thin-film transistor M2, an initialization-sensing thin-film transistor M3, and the storage capacitor Cst.

The driving thin-film transistor M1, the switching thin-film transistor M2, and the initialization-sensing thin-film transistor M3 may each be an oxide semiconductor thin-film transistor including a semiconductor layer including an oxide semiconductor material or a silicon semiconductor thin-film transistor including a semiconductor layer including polysilicon. According to transistor types, a first electrode may be one of a source electrode and a drain electrode, and a second electrode may be one of a source electrode and a drain electrode.

A first electrode of the driving thin-film transistor M1 may be connected to a driving voltage line VDL configured to provide the driving power voltage ELVDD, and a second electrode may be connected to a pixel electrode of the light-emitting diode LED. A gate electrode of the driving thin-film transistor M1 may be connected to a first node N1. The driving thin-film transistor M1 may control the amount of current flowing from the driving power voltage ELVDD to the light-emitting diode LED, according to a voltage of the first node N1.

A first electrode of the switching thin-film transistor M2 may be connected to a data line DL, and a second electrode may be connected to the first node N1. A gate electrode of the switching thin-film transistor M2 may be connected to a scan line SL. When a scan signal is provided through the scan line SL, the switching thin-film transistor M2 may be turned on and thus may electrically connect the data line DL to the first node N1.

The initialization-sensing thin-film transistor M3 may be an initialization transistor and/or a sensing transistor. A first electrode of the initialization-sensing thin-film transistor M3 may be connected to a second node N2, and the second electrode may be connected to an initialization sensing line ISL. A gate electrode of the initialization-sensing thin-film transistor M3 may be connected to a control line CL.

The initialization-sensing thin-film transistor M3 may be turned on when a control signal is provided through the control line CL and may electrically connect the initialization-sensing line ISL to the second node N2. In some embodiments, the initialization-sensing thin-film transistor M3 may be turned on in response to a signal transmitted through the control line CL and may initialize an electrode of the light-emitting diode LED according to an initialization voltage from the initialization-sensing line ISL. According to some embodiments, the initialization-sensing thin-film transistor M3 may be turned on when the control signal is provided through the control line CL and may sense feature information of the light-emitting diode LED. The initialization-sensing thin-film transistor M3 may include functions of both the initialization transistor and the sensing transistor or functions of any one of the initialization transistor and the sensing transistor. According to some embodiments, when the initialization-sensing thin-film transistor M3 has a function of the initialization transistor, the initialization sensing line ISL may be referred to as an initialization voltage line, and when the initialization-sensing thin-film transistor M3 has a function of the sensing transistor, the initialization sensing line ISL may be referred to as a sensing line. An initialization operation and a sensing operation of the initialization-sensing thin-film transistor M3 may be individually or simultaneously performed. Hereinafter, for convenience, it is described that the initialization-sensing thin-film transistor has functions of the initialization transistor and the sensing transistor.

The storage capacitor Cst may be connected between the first node N1 and the second node N2. For example, the first capacitor electrode of the storage capacitor Cst may be connected to a driving gate electrode of the driving thin-film transistor M1, and the second capacitor electrode of the storage capacitor Cst may be connected to the pixel electrode of the light-emitting diode LED.

FIG. 8 illustrates that the driving thin-film transistor M1, the switching thin-film transistor M2, and the initialization-sensing thin-film transistor M3 each are NMOS transistors, but one or more embodiments are not limited thereto. For example, at least one of the driving thin-film transistor M1, the switching thin-film transistor M2, or the initialization-sensing thin-film transistor M3 may be a PMOS transistor.

FIG. 8 illustrates three transistors, but embodiments according to the present disclosure are not limited thereto. The sub-pixel circuit PC may include four or more transistors.

Hereinafter, as described below, a sub-pixel circuit PC according to some embodiments of the present disclosure may include three (or at least three) transistors, that is, the driving thin-film transistor M1, the switching thin-film transistor M2, and the initialization-sensing thin-film transistor M3. The driving thin-film transistor M1, the switching thin-film transistor M2, and the storage capacitor Cst may be any one of the embodiments described with reference to FIGS. 1 to 4.

Figure 9:
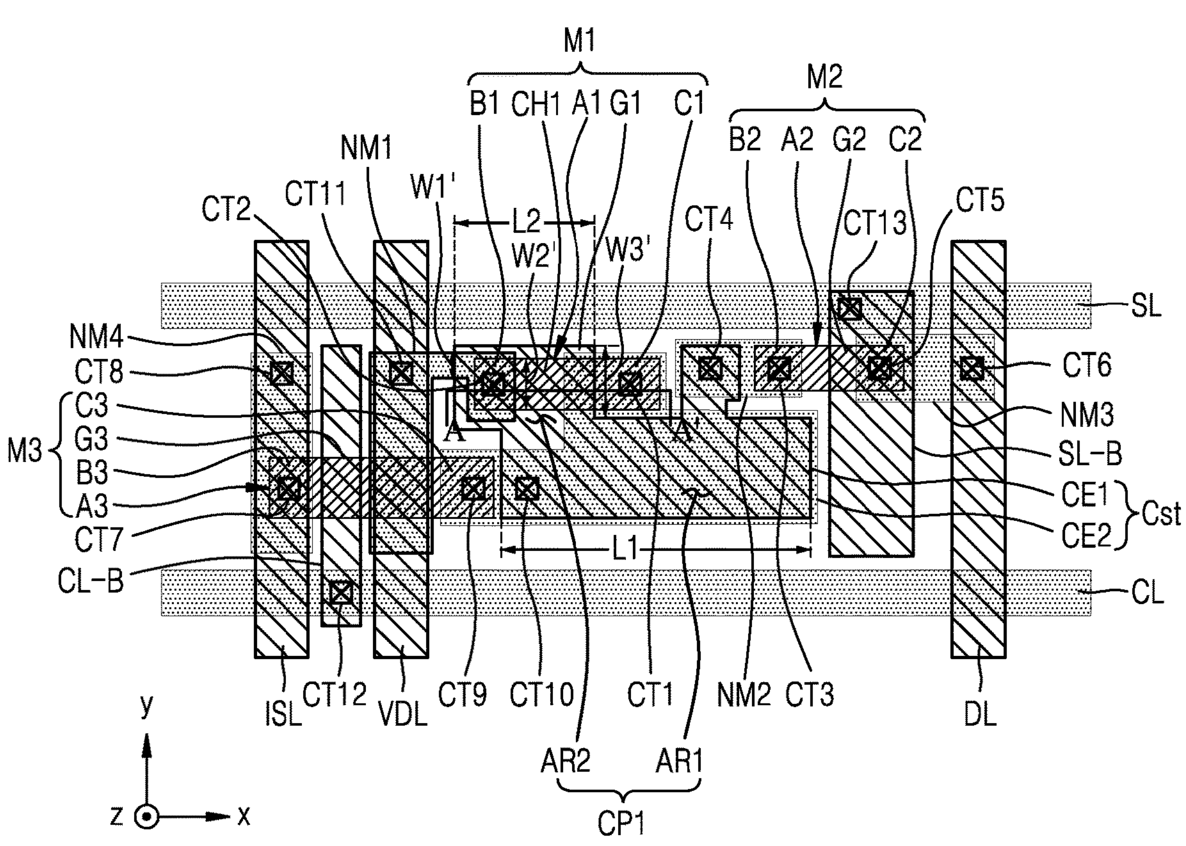
FIG. 9 is a plan view of a sub-pixel circuit according to some embodiments.

FIG. 9 is a plan view of a sub-pixel circuit according to some embodiments.

The sub-pixel circuit includes the driving thin-film transistor M1, the switching thin-film transistor M2, and the initialization-sensing thin-film transistor M3. The driving thin-film transistor M1, the switching thin-film transistor M2, the initialization-sensing thin-film transistor M3, and the storage capacitor Cst may be electrically connected to the light-emitting diode LED.

The driving thin-film transistor M1 may include a driving semiconductor layer A1 and a driving gate electrode G1. The driving semiconductor layer A1 may include a first low-resistance area B1 and a second low-resistance area C1, and a channel area CH1 may be located between the first low-resistance area B1 and the second low-resistance area C1. The first low-resistance area B1 and the second low-resistance area C1 may be areas having lower resistance than the channel area CH1 and may be formed by doping impurities or performing a conducting process. Any one of the first low-resistance area B1 and the second low-resistance area C1 may be a source area, and the other thereof may be a drain area. The driving gate electrode G1 may overlap the channel area CH1 of the driving semiconductor layer A1.

Any one of the first low-resistance area B1 and the second low-resistance area C1 of the driving semiconductor layer A1 may be connected to a storage capacitor Cst1, and the other thereof may be connected to the driving voltage line VDL. For example, the first low-resistance area B1 may be in contact with a second capacitor electrode CE2 of the storage capacitor Cst through a first contact hole CT1. The second low-resistance area C1 may be connected to the driving voltage line VDL through a first connection member NM1. The second low-resistance area C1 may be connected to the first connection member NM1 through a second contact hole CT2, and the first connection member NM1 may be connected to the driving voltage line VDL through an 11*th* contact hole CT11.

The storage capacitor Cst may include a first capacitor electrode CE1 and a second capacitor electrode CE2 arranged on the first capacitor electrode CE1. A portion of the first capacitor electrode CE1 may include the driving gate electrode G1. The above portion of the first capacitor electrode CE1 may extend to a lower portion of the driving semiconductor layer A1 to overlap the channel area CH1 thereof.

Figure 10:
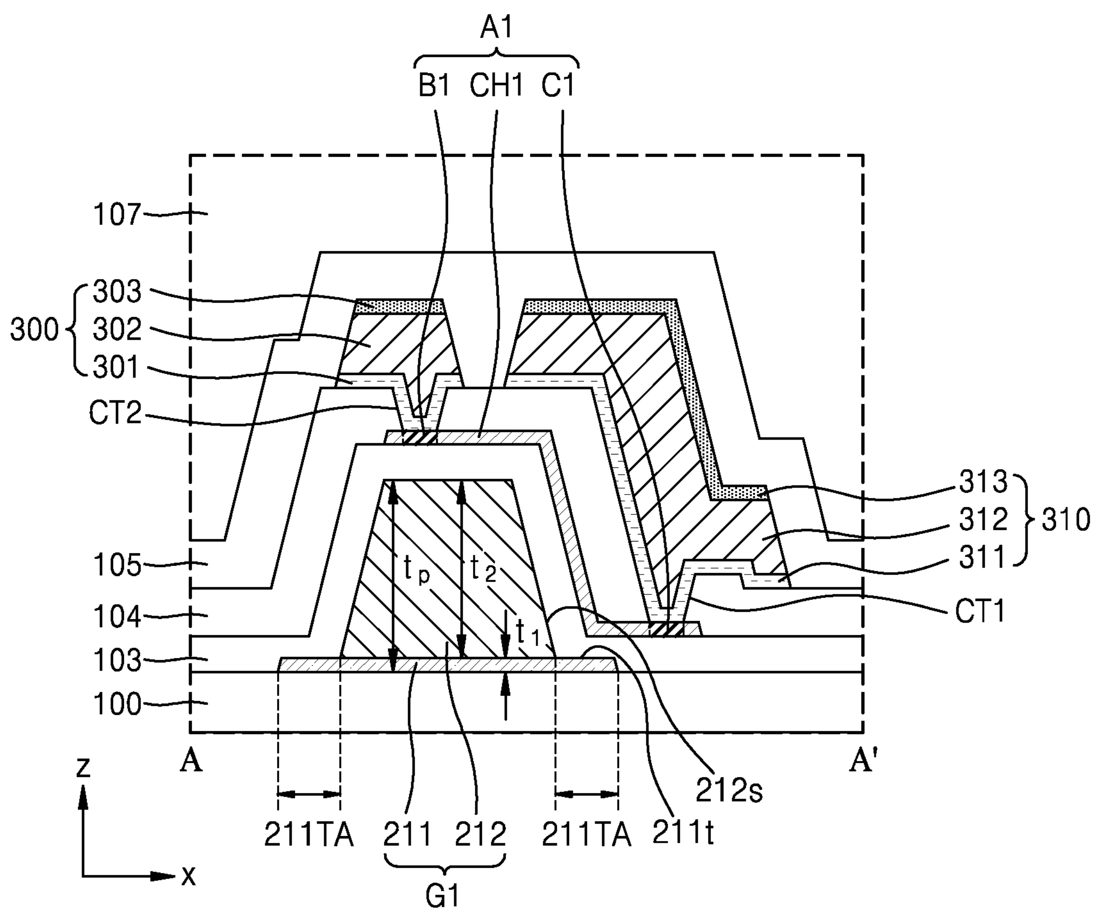
FIG. 10 is a cross-sectional view of the sub-pixel circuit of FIG. 9 taken along the line A-A' in FIG. 9 according to some embodiments.

In other words, the first capacitor electrode CE1 and the driving gate electrode G1 may be portions of a first conductive pattern CP1 formed on the substrate (100, FIG. 10). A portion of the first conductive pattern CP1 may overlap the second capacitor electrode CE2, and another portion of the first conductive pattern CP1 may extend between the substrate (100, FIG. 10) and the driving semiconductor layer A1 and overlap a portion of the driving semiconductor layer A1.

For example, the first conductive pattern CP1 may include a first portion AR1 overlapping the second capacitor electrode CE2 and a second portion AR2, which has a shape protruding in a direction towards the driving semiconductor layer A1, for example, in a y direction on a plane of FIG. 9. The second portion AR2 may include the driving gate electrode G1. The driving gate electrode G1 may overlap the channel area CH1 of the driving semiconductor layer A1.

As illustrated in FIG. 9, the second portion AR2 of the first conductive pattern CP1 may further extend in a direction, for example, a −x direction, towards the first low-resistance area B1 from the channel area CH1 and may overlap the channel area CH1 as well as a portion of the first low-resistance area B1. According to some embodiments, the second portion AR2 of the first conductive pattern CP1 may not overlap the first low-resistance area B1 and the second low-resistance area C1 of the driving semiconductor layer A1. According to some embodiments, a length L2 of the second portion AR2 in an x direction may be less than a length L1 of the first portion AR1 in the x direction. According to some embodiments, a length W3' of the second portion AR2 in a y direction may be greater than a length W2' of the driving semiconductor layer A1 in the y direction.

The switching thin-film transistor M2 may include a switching semiconductor layer A2 and a switching gate electrode G2. The switching semiconductor layer A2 may include a first low-resistance area B2 and a second low-resistance area C2, and a channel area may be located between the first low-resistance area B2 and the second low-resistance area C2. The switching gate electrode G2 may overlap the channel area of the switching semiconductor layer A2. The switching gate electrode G2 may correspond to a portion of the scan line SL, for example, a portion of a branch (hereinafter, referred to as a first branch SL-B) extending in the y direction crossing the scan line SL. The first branch SL-B may be electrically connected to the scan line SL through a 13*th* contact hole CT13.

The scan line SL may include the switching gate electrode G2. For example, the scan line SL may include the first branch SL-B extending in the y direction, and a portion of the first branch SL-B may correspond to the switching gate electrode G2 of the switching thin-film transistor M2.

One of the first low-resistance area B2 and the second low-resistance area C2 of the switching semiconductor layer A2 may be electrically connected to the data line DL, and the other thereof may be electrically connected to the storage capacitor Cst. For example, the first low-resistance area B2 may be connected to a second connection member NM2 through a third contact hole CT3, and the second connection member NM2 may be connected to the first capacitor electrode CE1 of the storage capacitor Cst through a fourth contact hole CT4. Therefore, the second low-resistance area C2 may be connected to the first capacitor electrode CE1 of the storage capacitor Cst by the second connection member NM2. The second low-resistance area C2 may be connected to a third connection member NM3 through a fifth contact hole CT5, and the third connection member NM3 may be connected to the data line DL through a sixth contact hole CT6. The second low-resistance area C2 may be connected to the data line DL by the third connection member NM3.

The initialization-sensing transistor M13 may include an initialization-sensing semiconductor layer A3 and an initialization-sensing gate electrode G3. The initialization-sensing semiconductor layer A3 may include a first low-resistance area B3 and a second low-resistance area C3, and a channel area may be located between the first low-resistance area B3 and the second low-resistance area C3. The initialization-sensing gate electrode G3 may overlap the channel area of the initialization-sensing semiconductor layer A3.

The control line CL may include the initialization-sensing gate electrode G3 of the initialization-sensing transistor M13. The initialization-sensing gate electrode G3 may correspond to a portion of the control line CL, for example, a portion of a branch (hereinafter, referred to as a second branch CL-B) extending in the y direction crossing the control line CL. The second branch CL-B may extend between the driving voltage line VDL and the initialization-sensing line ISL. The second branch CL-B may be electrically connected to the control line CL through a $12^{th}$ contact hole CT12.

One of the first low-resistance area B3 and the second low-resistance area C3 of the initialization-sensing semiconductor layer A3 may be electrically connected to the initialization-sensing line ISL, and the other thereof may be electrically connected to the storage capacitor Cst. For example, the first low-resistance area B3 may be connected to a fourth connection member NM4 through a seventh contact hole CT7, and the fourth connection member NM4 may be connected to the initialization-sensing line ISL through an eighth contact hole CT8. Therefore, the first low-resistance area B3 may be electrically connected to the initialization-sensing line ISL by the fourth connection member NM4. The second low-resistance area C3 may be electrically connected to the second capacitor electrode CE2 of the storage capacitor Cst through a ninth contact hole CT9.

The first capacitor electrode CE1 and the second capacitor electrode CE2 of the storage capacitor Cst may be in contact with each other through a tenth contact hole CT10. The first capacitor electrode CE1 and the second capacitor electrode CE2 may have the same voltage level.

According to some embodiments, the sub-pixel circuit may be electrically connected to a light-emitting diode through a contact hole included in the planarization layer (107, FIG. 10).

FIG. 10 is a cross-sectional view of a display apparatus taken along the line A-A' of FIG. 9.

Referring to FIGS. 9 and 10, the driving gate electrode G1 may be arranged on the substrate 100. According to some embodiments, the initialization sensing line ISL, the driving voltage line VDL, the data line DL, the first branch SL-B, and the second branch CL-B may be arranged on the same layer and include the same material as the driving gate electrode G1.

The driving gate electrode G1 may include a plurality of sub-layers. For example, the driving gate electrode G1 may include the first sub-layer 211 and the second sub-layer 212. A width of the first sub-layer 211 may be greater than that of the second sub-layer 212. The first sub-layer 211 may include the tail areas 211TA extending from a point at which the upper surface 211*t* of the first sub-layer 211 meets the side surface 212*s* of the second sub-layer 212.

The thickness t2 of the second sub-layer 212 may be greater than the thickness t1 of the first sub-layer 211. The second sub-layer 212 may be a sub-layer occupying most of the driving gate electrode G1. The description that the second sub-layer 212 occupies most of the driving gate electrode G1 may indicate that the thickness t2 of the second sub-layer 212 is about 50% of the total thickness tp of the driving gate electrode 210 with respect to the center of the second sub-layer 212. The tail areas 211TA may be arranged on both sides of the second sub-layer 212 with respect to the center thereof. Detailed materials and shapes of the first sub-layer 211 and the second sub-layer 212 of the driving gate electrode G1 are the same as those described above with reference to FIGS. 1 and 2.

For example, a length of each tail area 211TA may be equal to or greater than about 1 μm. When the length of the tail area 211TA is less than about 1 μm, the first sub-layer 211 may not overlap a portion of the channel area CH1, and an electric field may not be easily formed according to a driving gate voltage in the portion of the channel area CH1. In some embodiments, the length of the tail area 211TA is greater than about 1 μm and less than or equal to about 2 μm. When the length of the tail area 211TA is greater than about 2 μm, a distance between another wire and the driving gate electrode G1 may decrease, and thus, a short circuit may be generated.

The gate insulating layer 103 may cover the driving gate electrode G1. The driving semiconductor layer A1 may be arranged on the gate insulating layer 103. The driving semiconductor layer A1 may include the first low-resistance area B1, the second low-resistance area C1, and the channel area CH1 therebetween. The channel area CH1 may be arranged along a side surface of the driving gate electrode G1. According to some embodiments, any one of the first low-resistance area B1 and the second low-resistance area C1 may include an area that does not overlap the driving gate electrode G1.

A vertical distance between the upper surface of the substrate 100 and the first low-resistance area B1 may be different from a vertical distance between the upper surface of the substrate 100 and the second low-resistance area C1. In other words, the first low-resistance area B1 and the second low-resistance area C1 may be at different levels.

The interlayer insulating layer 104 may be arranged to cover the driving semiconductor layer A1. The first electrode 300 and the second electrode 310 may be arranged on the interlayer insulating layer 104. The first electrode 300 may be part of the first connection member NM1, and the second electrode 310 may be part of the second capacitor electrode CE2. According to some embodiments, the first connection member NM1, the second connection member NM2, the third connection member NM3, the fourth connection member NM4, a fifth connection member NM5, a sixth connection member NM6, a seventh connection member NM7, an eighth connection member NM8, and the second capacitor electrode CE2 may be on the same layer and include the same material as the first electrode 300 and the second electrode 310.

The first electrode 300 may be connected to the first low-resistance area B1 of the driving semiconductor layer A1 through the second contact hole CT2, and the second electrode 310 may be connected to the second low-resistance area C1 of the driving semiconductor layer A1 through the first contact hole CT1. The first electrode 300 and the second electrode 310 may include a single conductive layer or a plurality of conductive layers. According to some embodiments, as illustrated in FIG. 10, the first electrode 300 and the second electrode 310 may each have a three-layer structure including the first electrode layers 301 and 311, the second electrode layers 302 and 312, and the third electrode layers 303 and 313. Detailed materials of the first electrode layers 301 and 311, the second electrode layers 302 and 312, and the third electrode layers 303 and 313 are the same as those described above with reference to FIGS. 1 and 2.

According to some embodiments, the first electrode 300 may be arranged to overlap the first low-resistance area B1 and the peripheral portion of the driving semiconductor layer A1, but the second electrode 310 may extend to overlap the second low-resistance area C1 and most portions of the channel area CH1 of the driving semiconductor layer A1, for example, portions close to the first low-resistance area B1.

Referring to FIGS. 9 and 10, in an area where the first connection member NM1 does not overlap the driving semiconductor layer A1 in a plane, the first connection member NM1 may include some regions having a first width W1' in the y direction that is less than a length W2' of the driving semiconductor layer A1 in the y direction. Accordingly, the first connection member NM1 may decrease a region that unnecessarily overlaps the first conductive pattern CP1 including the driving gate electrode G1 and may prevent or reduce instances of a parasitic capacitance being generated.

The passivation layer 105 and the planarization layer 107 may be sequentially arranged on the first electrode 300 and the second electrode 310. A light-emitting diode may be arranged on the planarization layer 107, and according to some embodiments, a driving thin-film transistor may be electrically connected to a driving light-emitting diode through a contact hole formed in the planarization layer 107.

According to the one or more embodiments, a display apparatus may include a driving gate electrode including a plurality of sub-layers and a driving semiconductor layer arranged along a side surface of the driving gate electrode so that a relatively high-resolution display apparatus may be realized. However, the scope of embodiments according to the present disclosure is not limited by such effects.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims, and their equivalents.

What is claimed is:

1. A display apparatus comprising:

a thin-film transistor;

a storage capacitor electrically connected to the thin-film transistor; and a light-emitting diode electrically connected to the thin-film transistor and the storage capacitor, wherein the thin-film transistor comprises:

a gate electrode on a substrate and comprising a first sub-layer and a second sub-layer on the first sub-layer;

a semiconductor layer on the gate electrode and comprising a channel area, a first low-resistance area, and a second low-resistance area, wherein the channel area overlaps the gate electrode, and the first and second low-resistance areas are at a same layer and extending at both sides of the channel area, and a first electrode overlapping and electrically connected to one of the first low-resistance area or the second low-resistance area, and the channel area between the first electrode and the gate electrode in a thickness direction of the display apparatus, wherein a width of the first sub-layer is greater than a width of the second sublayer, the channel area is arranged along a side surface of the second sub-layer, the storage capacitor comprises a first capacitor electrode and a second capacitor electrode on the first capacitor electrode, and the first capacitor electrode is on a same layer and comprises a same material as the gate electrode.

2. The display apparatus of claim 1, wherein the first capacitor electrode comprises:

a first capacitor sub-layer comprising a same material as the first sub-layer; and a second capacitor sub-layer comprising a same material as the second sub-layer.

3. The display apparatus of claim 1, wherein a thickness of the second sub-layer is greater than a thickness of the first sub-layer.

4. The display apparatus of claim 1, wherein the first sub-layer comprises tail areas extending from a point at which an upper surface of the first sub-layer meets the side surface of the second sub-layer, and a length of each tail area is equal to or greater than 1 μm.

5. The display apparatus of claim 1, wherein the gate electrode is a portion of a first conductive pattern comprising the first capacitor electrode.

6. The display apparatus of claim 5, wherein the first conductive pattern comprises a first portion, which overlaps the second capacitor electrode in a plan view, and a second portion, which protrudes from the first portion in one direction.

7. The display apparatus of claim 1, wherein the storage capacitor comprises a connection electrode between and overlapping the first capacitor electrode and the second capacitor electrode, and the connection electrode is in contact with the second capacitor electrode.

8. The display apparatus of claim 7, wherein the connection electrode is on a same layer and comprises a same material as the semiconductor layer.

9. The display apparatus of claim 1, wherein the semiconductor layer comprises an oxide semiconductor material.

10. The display apparatus of claim 1, wherein the first electrode comprises a tri-layer comprising a conductive material.

11. A display apparatus comprising:

a substrate;

a driving power line extending on the substrate in a first direction;

a driving thin-film transistor electrically connected to the driving power line; and a storage capacitor electrically connected to the driving thin-film transistor and comprising a first capacitor electrode and a second capacitor electrode overlapping the first capacitor electrode, wherein the driving thin-film transistor comprises:

a driving gate electrode comprising a first sub-layer on the substrate and a second sub-layer on the first sub-layer;

a gate insulating layer on the driving gate electrode;

a driving semiconductor layer on the gate insulating layer and comprising a channel area, a first low-resistance area, and a second low-resistance area, wherein the channel area overlaps the driving gate electrode, and the first and second low-resistance areas are at a same layer and extending at both sides of the channel area, and a first electrode overlapping and electrically connected to one of the first low-resistance area or the second low-resistance area, and the channel area between the first electrode and the driving gate electrode in a thickness direction of the display apparatus, wherein a width of the first sub-layer is greater than a width of the second sublayer, the channel area is arranged along a side surface of the second sub-layer, and the first capacitor electrode comprises a first capacitor sub-layer, which comprises a same material as the first sub-layer, and a second capacitor sub-layer, which comprises a same material as the second sub-layer.

12. The display apparatus of claim 11, wherein at least one of the first low-resistance area or the second low-resistance area comprises an area that does not overlap the driving gate electrode.

13. The display apparatus of claim 11, wherein a vertical distance between an upper surface of the substrate and the first low-resistance area is different from a vertical distance between the upper surface of the substrate and the second low-resistance area.

14. The display apparatus of claim 11, wherein a portion of the first capacitor electrode comprises the driving gate electrode, and the portion of the first capacitor electrode extends to a lower portion of the driving semiconductor layer to overlap the channel area of the driving semiconductor layer.

15. The display apparatus of claim 11, further comprising:

a data line extending in the first direction; and a switching thin-film transistor electrically connected to the driving thin-film transistor and the data line.

16. The display apparatus of claim 11, further comprising:

a sensing line extending in the first direction; and a sensing thin-film transistor electrically connected to the driving thin-film transistor and the sensing line.

17. The display apparatus of claim 11, wherein a thickness of the second sub-layer is greater than a thickness of the first sub-layer.

18. The display apparatus of claim 11, wherein the first sub-layer comprises tail areas extending from a point at which an upper surface of the first sub-layer meets the side surface of the second sub-layer, and a length of each tail area is equal to or greater than 1 μm.

19. The display apparatus of claim 11, wherein the storage capacitor further comprises a connection electrode between and overlapping the first capacitor electrode and the second capacitor electrode, and the connection electrode is in contact with the second capacitor electrode.

20. The display apparatus of claim 19, wherein the connection electrode is on a same layer and comprises a same material as the driving semiconductor layer.

21. The display apparatus of claim 1, wherein the second sub-layer overlaps the first low-resistance area and does not overlap the second low-resistance area.

* * * * *